United States Patent
Sakata

(10) Patent No.: US 10,203,590 B2
(45) Date of Patent: Feb. 12, 2019

(54) ILLUMINATOR AND PROJECTOR

(71) Applicant: SEIKO EPSON CORPORATION, Tokyo (JP)

(72) Inventor: Hidefumi Sakata, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/872,925

(22) Filed: Jan. 16, 2018

(65) Prior Publication Data
US 2018/0210329 A1    Jul. 26, 2018

(30) Foreign Application Priority Data
Jan. 23, 2017   (JP) .................. 2017-009614

(51) Int. Cl.
| | |
|---|---|
| *G03B 21/20* | (2006.01) |
| *G02B 5/02* | (2006.01) |
| *G02B 5/30* | (2006.01) |
| *H01S 5/02* | (2006.01) |
| *F21V 13/04* | (2006.01) |
| *H04N 9/31* | (2006.01) |
| *G02B 19/00* | (2006.01) |
| *F21V 5/00* | (2018.01) |
| *G02B 27/09* | (2006.01) |

(Continued)

(52) U.S. Cl.
CPC .......... *G03B 21/2013* (2013.01); *F21V 5/007* (2013.01); *F21V 13/04* (2013.01); *G02B 5/02* (2013.01); *G02B 5/30* (2013.01); *G02B 19/0004* (2013.01); *G03B 21/208* (2013.01); *H01S 5/02* (2013.01); *H04N 9/3102* (2013.01); *G02B 3/0062* (2013.01); *G02B 19/0014* (2013.01); *G02B 19/0057* (2013.01); *G02B 26/008* (2013.01); *G02B 27/0905* (2013.01); *G02B 27/149* (2013.01); *G02B 27/286* (2013.01); *G02B 27/30* (2013.01)

(58) Field of Classification Search
CPC .. G03B 21/28; G03B 21/208; G03B 21/2013; G03B 21/2033; G03B 21/2053; F21V 5/04; F21V 5/07; F21V 5/08; F21V 5/041
See application file for complete search history.

(56) References Cited

U.S. PATENT DOCUMENTS

| | | | |
|---|---|---|---|
| 2012/0229775 A1* | 9/2012 | Itoh .................... | G02B 27/0961 353/30 |
| 2013/0010215 A1* | 1/2013 | Taketsu ............. | G02B 19/0057 349/8 |

(Continued)

FOREIGN PATENT DOCUMENTS

| | | |
|---|---|---|
| JP | 2013-120250 A | 6/2013 |
| JP | 2014-138148 A | 7/2014 |

*Primary Examiner* — Sultan Chowdhury
(74) *Attorney, Agent, or Firm* — Oliff PLC

(57) ABSTRACT

An illuminator includes a light source, a collimation system on which a light beam flux emitted from the light source is incident, and a light forming system including a lens array including a plurality of lenses. The plurality of lenses each have a lens surface having a non-rotationally symmetric free-form surface. The light forming system is configured to cause the plurality of lenses to divide the light beam flux having passed through the collimation system into a plurality of sub-light beam fluxes and the plurality of sub-light beam fluxes to be incident on an illuminated area.

18 Claims, 9 Drawing Sheets

(51) Int. Cl.
  *G02B 3/00*    (2006.01)
  *G02B 26/00*   (2006.01)
  *G02B 27/14*   (2006.01)
  *G02B 27/28*   (2006.01)
  *G02B 27/30*   (2006.01)

(56) References Cited

U.S. PATENT DOCUMENTS

2015/0309399 A1\* 10/2015 Kim .................. F21V 13/14
                                                353/33
2016/0037142 A1\* 2/2016 Nakajima ............ H04N 9/3144
                                                353/20
2016/0274344 A1\* 9/2016 Lin .................... G02B 17/0856

\* cited by examiner

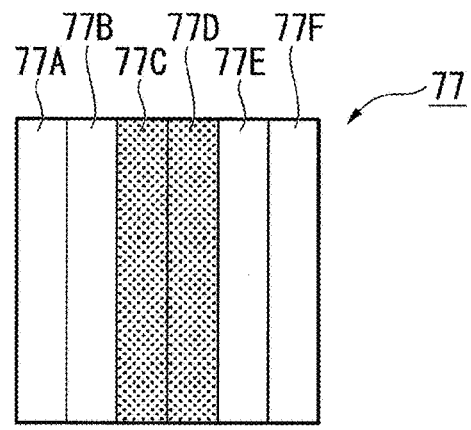
FIG.5A
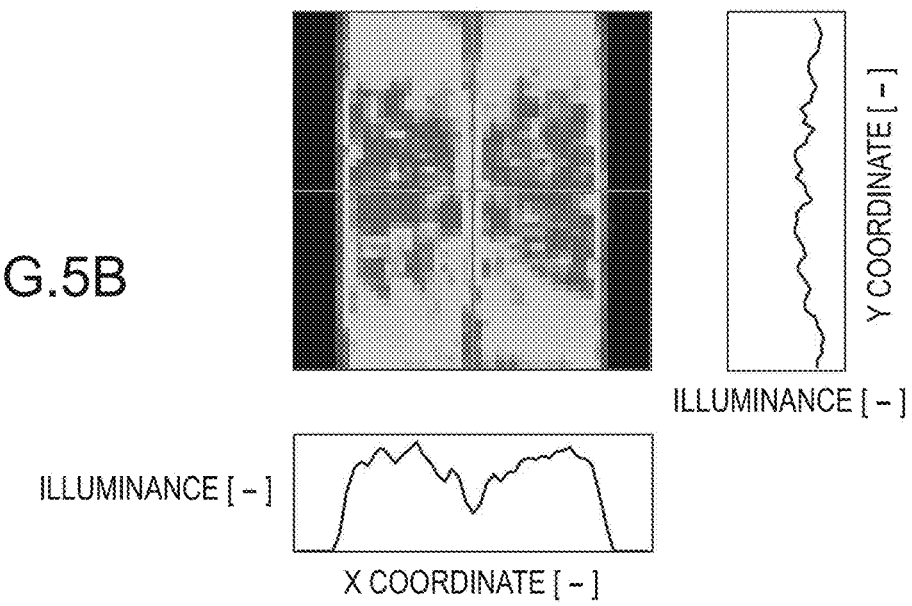
FIG.5B
FIG.5C
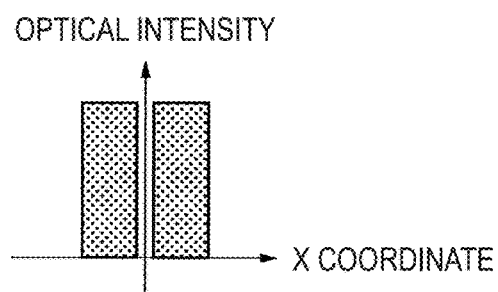

ILLUMINATOR AND PROJECTOR

BACKGROUND

1. Technical Field

The present invention relates to an illuminator and a projector.

2. Related Art

As an illuminator used in a projector and other apparatus, there has been a proposed illuminator in which a phosphor is irradiated with excitation light emitted from a semiconductor laser or any other excitation light source and fluorescence generated by the phosphor is used.

JP-A-2013-120250 discloses a light source unit including an excitation light source, a phosphor, a diffuser plate disposed between the excitation light source and the phosphor, and alight collecting lens disposed in the vicinity of the phosphor. In the light source unit, excitation light from the excitation light source is diffused by the diffuser plate, and the phosphor is irradiated with the diffused excitation light. The diffuser plate, which diffuses the excitation light, can lower the power density of the excitation light with which the phosphor is irradiated. Lowering the power density of the excitation light on the phosphor allows high-efficiency conversion of the excitation light into fluorescence.

JP-A-2014-138148 discloses a light source apparatus including a blue semiconductor laser array (B-LD array), two multi-lens arrays, lenses, and a phosphor wheel. In the light source apparatus, which includes the two multi-lens arrays and the lenses, the power density of excitation light with which the phosphor is irradiated is low, and the uniformity of the illuminance distribution of the excitation light is increased.

In the light source unit described in JP-A-2013-120250, when the diffusion angle is increased to lower the power density for an increase in the uniformity of the illuminance distribution, the size of an excitation light spot on the phosphor is increased, and the fluorescence use efficiency decreases accordingly. To reduce the decrease in the fluorescence use efficiency, the light collecting lens needs to be enlarged.

In the light source apparatus described in JP-A-2014-138148, the two multi-lens arrays are required to homogenize the blue light illuminance distribution on the phosphor wheel, resulting in problems of an increase in the number of parts of the light source apparatus, an increase in the size of the light source apparatus, and the like.

SUMMARY

An advantage of some aspects of the invention is to provide an illuminator that allows improvement in the uniformity of the illuminance distribution across an illuminated area with increase in the number of parts and increase in the size of the entire illuminator suppressed. Another advantage of some aspects of the invention is to provide a projector including the illuminator.

An illuminator according to an aspect of the invention includes a light source, a collimation system on which a light beam flux emitted from the light source is incident, and a light forming system including a lens array including a plurality of lenses. The plurality of lenses each have a lens surface having a non-rotationally symmetric free-form surface. The light forming system is configured to cause the plurality of lenses to divide the light beam flux having passed through the collimation system into a plurality of sub-light beam fluxes and the plurality of sub-light beam fluxes to be incident on an illuminated area.

In the present specification, the "illuminated area" is an area that is part of an illuminated object and should be illuminated by the illuminator. A "light irradiated area" is an area that is part of the illuminated object and actually irradiated with the plurality of sub-light beam fluxes. Further, a lens having a lens surface formed of a free-form surface is also referred to as a "free-form surface lens" in some cases.

According to the illuminator of the aspect of the invention, adjustment of the shape of the light irradiated area and homogenization of the illuminance distribution across the illuminated area are shared by a plurality of lenses, whereby the uniformity of the illuminance distribution across the illuminated area can be improved with an increase in the number of parts and an increase in the size of the entire illuminator suppressed.

In the illuminator according to the aspect of the invention, a spot formed by the light beam flux on the lens array may have a longitudinal direction, and the plurality of lenses may be arranged in a direction that interests the longitudinal direction.

According to the configuration described above, the uniformity of the illumination distribution across the illuminated area can be increased, and the power density in the illuminated area can be lowered.

In the illuminator according to the aspect of the invention, let an x direction and a y direction be two directions perpendicular to each other in a plane perpendicular to an optical axis of one of the plurality of lenses, and a shape of the lens surface is expressed by Expression (1) containing x and y as variables.

$$z = \frac{cr^2}{1 + \sqrt{1 - (1+k)c^2 r^2}} + \sum_{j=2}^{s} c_j x^m y^n \quad (1)$$

According to the configuration described above, the lens design can be readily performed because the curvature of the lens surface in the x direction and the curvature of the lens surface in the y direction can be designed independently of each other.

In the illuminator according to the aspect of the invention, Expression (1) may contain at least one term expressed by $x^{2p} \cdot y^{2p}$, where p is a positive integer.

According to the configuration described above, the size of the light irradiated area in an xy plane and in directions that intersect both the x and y directions can be readily adjusted. That is, the shape of the corners of the light irradiated area can be readily adjusted.

In the illuminator according to the aspect of the invention, a coefficient Cj of a term $x^h$ may differ from the coefficient Cj of a term $y^h$, where h is a positive integer.

According to the configuration described above, the size of the light irradiated area can be adjusted in the x and y directions independently of each other.

In the illuminator according to the aspect of the invention, a coefficient Cj of a term $x^2 \cdot y^4$ may differ from the coefficient Cj of a term $x^4 \cdot y^2$.

According to the configuration described above, the size of the light irradiated area can be adjusted with accuracy in the diagonal directions, the x direction, and the y direction.

In the illuminator according to the aspect of the invention, the plurality of sub-light beam fluxes may include a first sub-light beam flux and a second sub-light beam flux and the lens array may be configured to cause the first sub-light beam flux and the second sub-light beam flux to travel in directions different from each other.

According to the configuration described above, the positions where the first and second sub-light beam fluxes are incident on the illuminated area can be adjusted. The illuminance distribution across the illuminated area is therefore readily homogenized.

In the illuminator according to the aspect of the invention, the plurality of sub-light beam fluxes may include a first sub-light beam flux and a second sub-light beam flux, the light forming system may further include a light collecting system, and the light collecting system may be configured to cause the first sub-light beam flux and the second sub-light beam flux to travel in directions different from each other.

According to the configuration described above, the positions where the first and second sub-light beam fluxes are incident on the illuminated area can be adjusted. The illuminance distribution across the illuminated area is therefore readily homogenized. Further, unlike in a case where the light forming system includes no light collecting system, the free-form surfaces, which are lens surfaces, do not need to have the function of deflecting the sub-light beam fluxes, whereby the lens design can be performed with increased flexibility.

The illuminator according to the aspect of the invention may further include a light separation element provided on an optical path between the lens array and the light collecting system and a diffuser/reflector on which the plurality of sub-light beam fluxes are incident via the light collecting system.

According to the configuration described above, the plurality of sub-light beam fluxes diffused by the diffuser/reflector can be extracted as illumination light via the light separation element.

In the illuminator according to the aspect of the invention, the light forming system may be configured to cause a principal ray of the first sub-light beam flux and a principal ray of the second sub-light beam flux to be incident on positions different from each other in the illuminated area.

According to the configuration described above, the illuminance distribution across the illuminated area is readily homogenized. Further, the shape of the light irradiated area can be readily adjusted.

A projector according to another aspect of the invention includes the illuminator according to the aspect of the invention, a light modulator that modulates illumination light from the illuminator in accordance with image information to produce image light, and a projection system that projects the image light.

The projector according to the aspect of the invention includes the illuminator according to the aspect of the invention and can therefore provide a bright image.

The projector according to the aspect of the invention may further include a wavelength conversion element that converts the plurality of sub-light beam fluxes into fluorescence, and the illuminator may output the fluorescence as the illumination light.

According to the configuration described above, a projector using the fluorescence as the illumination light can be provided.

In the projector according to the aspect of the invention, the illuminator may output the plurality of sub-light beam fluxes as the illumination light.

According to the configuration described above, a projector using the plurality of sub-light beam fluxes as the illumination light can be provided.

BRIEF DESCRIPTION OF THE DRAWINGS

The invention will be described with reference to the accompanying drawings, wherein like numbers reference like elements.

FIG. 5A is a plan view showing the positions of two central lenses in a lens array in Example.

FIG. 5B shows the illuminance distribution produced by the lens in FIG. 5A across the illuminated area.

FIG. 5C shows a conceptual expression of the illuminance distribution produced by the lens in FIG. 5A across the illuminated area.

DESCRIPTION OF EXEMPLARY EMBODIMENTS

First Embodiment

A first embodiment of the invention will be described below with reference to FIGS. 1 to 11.

In the following drawings, components are drawn at different dimensional scales in some cases for clarity of each of the components.

Figure 1:
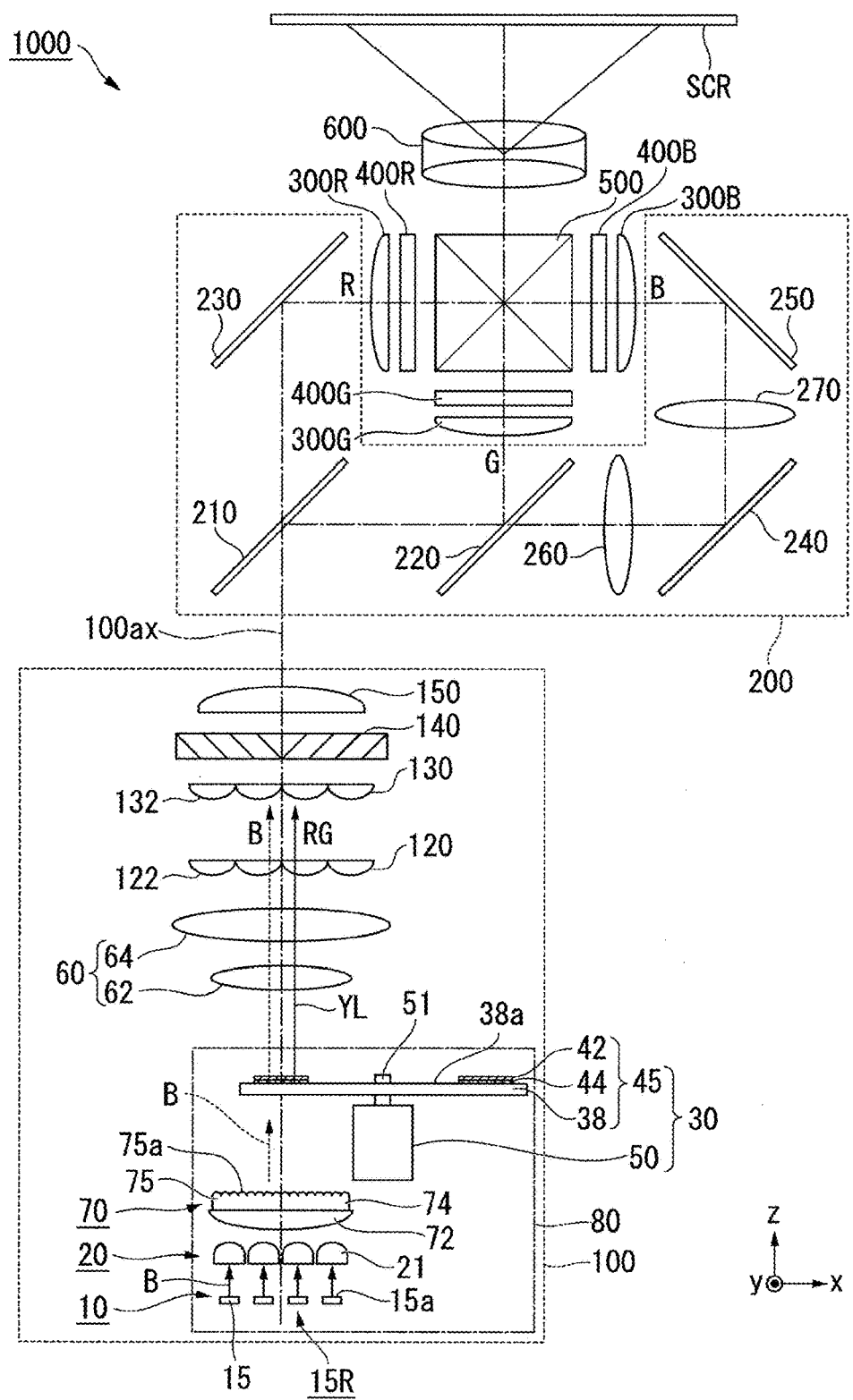
FIG. 1 is a schematic configuration diagram of a projector according to a first embodiment.

FIG. 1 shows the optical system of a projector 1000 according to the present embodiment.

The projector 1000 includes an illuminator 100, a color separation/light guide system 200, light modulators 400R, 400G, and 400B, a cross dichroic prism 500, and a projection system 600, as shown in FIG. 1.

The illuminator 100 includes a light source apparatus 80, a pickup system 60, a first lens array 120, a second lens array 130, a polarization conversion element 140, and a superimposing lens 150. The light source apparatus 80 includes a light source 10, a collimation system 20, a light forming system 70, and a wavelength conversion element 30.

The light source 10 emits blue light B. A phosphor layer 42 converts part of the blue light B emitted from the light source 10 into fluorescence YL containing green light G and red light R and outputs the fluorescence YL along with the other part of the blue light B. The light source apparatus 80 thus outputs white light.

The light source 10 includes a plurality of semiconductor lasers 15. The semiconductor lasers 15 each emits blue light B, for example, having a peak wavelength of 445 nm. It is, however, noted that the semiconductor lasers 15 may instead each emit blue light B having a peak wavelength other than 445 nm, for example, blue light B having a peak wavelength of 460 nm. In the following description, an orthogonal coordinate system in which the direction of the principle ray of the blue light B coincides with a z direction is used. The plurality of semiconductor lasers are arranged in a two-dimensional array with the semiconductor lasers separate from each other by a predetermined distance in the x-axis and y-axis directions.

In the present embodiment, the plurality of semiconductor lasers 15 are arranged in an array formed of four rows and four columns in an xy plane. That is, the array of the plurality of semiconductor lasers 15 has four semiconductor laser columns 15R arranged in the x direction. Each of the semiconductor laser columns 15R has four semiconductor lasers 15 arranged in the y direction.

The semiconductor lasers 15 each have a light exiting surface 15a, through which the light is emitted. The light exiting surface 15a has a roughly rectangular shape having a longitudinal direction and a lateral direction in a plan view viewed in the z direction. In the present embodiment, the longitudinal direction of the light exiting surface is parallel to the x direction, and the lateral direction of the light exiting surface is parallel to the y direction.

The blue light B emitted from each of the semiconductor lasers 15 is formed, for example, of linearly polarized light having a polarization direction parallel to the longitudinal direction of the light exiting surface. The angle of divergence of the blue light B in the lateral direction in the light exiting surface is greater than the angle of divergence of the blue light B in the longitudinal direction in the light exiting surface. The cross-sectional shape of the blue light B in an xy plane is therefore an elliptical shape having a longitudinal direction that coincides with the y direction and a lateral direction that coincides with the x direction.

Although not shown in FIG. 1, the semiconductor lasers 15 are mounted on a base substrate. The base substrate is desirably made of a metal having high thermal conductivity, such as copper, to effectively dissipate heat generated by the semiconductor lasers 15. The semiconductor lasers 15 may instead be mounted on the base substrate via a sub-mount. Further, a heat sink or any other cooler may be provided on the surface of the base substrate that is opposite the surface on which the semiconductor lasers are mounted.

The collimation system 20 includes a plurality of collimator lenses 21 arranged in a two-dimensional array in correspondence with the arrangement of the plurality of semiconductor lasers 15. The collimator lenses 21 are each formed of a convex lens. The light beam flux emitted from each of the plurality of semiconductor lasers 15 is parallelized when passing through the corresponding one of the plurality of collimator lenses 21, which form the collimation system 20.

The light forming system 70 includes a light collecting lens 72 and a lens array 74, which includes a plurality of lenses 75. The plurality of lenses 75 each have a lens surface 75a formed of a non-rotationally symmetric free-form surface. The light forming system 70 is configured to cause the plurality of lenses 75 to divide the light beam flux having passed through the collimation system 20 into a plurality of sub-light beam fluxes and the plurality of sub-light beam fluxes to be incident on the illuminated area (phosphor layer 42). In the present embodiment, the light collecting lens 72 is integrated with the lens array 74, but the light collecting lens 72 and the lens array 74 may instead be separate from each other.

Figure 2:
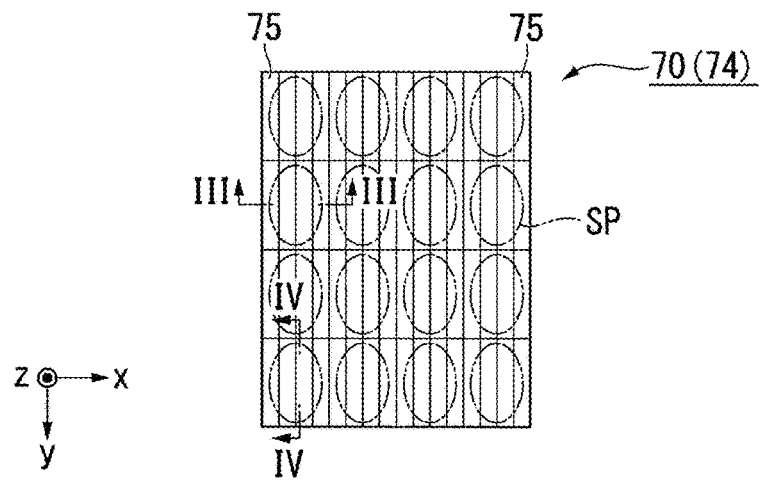
FIG. 2 is a plan view of a lens array.

FIG. 2 is a plan view of the light forming system 70 viewed from the side facing the lens array 74.

The plurality of lenses 75 are arranged in a two-dimensional array in an xy plane, as shown in FIG. 2. In the present embodiment, the plurality of lenses 75 are formed of 16 lenses 75 arranged in the x direction and four lenses 75 arranged in the y direction in an xy plane.

In the thus configured lens array 74, one light beam flux emitted from one semiconductor laser 15 is incident on a train of four lenses 75 arranged in the x-axis direction. The one light beam flux incident on the four lenses 75 is therefore divided into four sub-light beam fluxes. A spot SP formed on the lens array 74 by the one light beam flux has a longitudinal direction that coincides with the y direction, as described above. The four lenses 75 on which the one light beam flux is incident are arranged in the lateral direction of the spot SP, which intersects the longitudinal direction of the spot SP. The number of lenses 75 on which the one light beam flux is incident is not limited to four and can be changed as appropriate.

Figure 3:
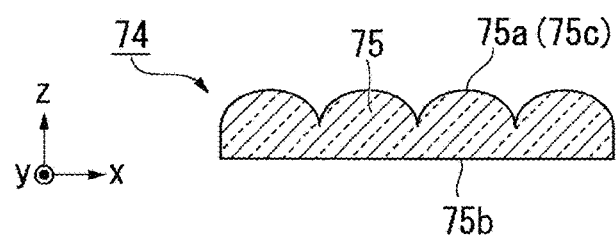
FIG. 3 is a cross-sectional view of the lens array taken along a plane perpendicular to a y direction.
Figure 4:
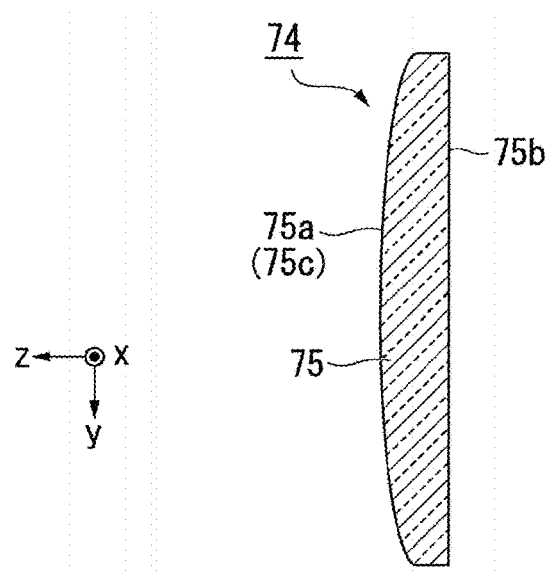
FIG. 4 is a cross-sectional view of the lens array taken along a plane perpendicular to an x direction.

FIG. 3 is a cross-sectional view of the lens array 74 taken along a plane perpendicular to the y direction. FIG. 4 is a cross-sectional view of the lens array 74 taken along a plane perpendicular to the x direction. FIGS. 3 and 4 show only the four lenses 75 on which the one light beam flux is incident.

The lenses 75 each have a light incident surface 75b, on which the light beam flux having exited out of the light collecting lens 72 is incident, and a light exiting surface 75c, through which the light beam flux having passed through the lens 75 exits, as shown in FIGS. 3 and 4. The light incident surface 75b is a flat surface, and the light exiting surface 75c is a convex surface. The light exiting surface 75c is the lens surface 75a formed of a non-rotationally symmetric free-form surface.

In the case where the light collecting lens 72 and the lens array 74 are integrated with each other, the light incident surface 75b is an imaginary surface that is set between the light exiting surfaces 75c and the light incident surface of the light collecting lens 72 and is parallel to the xy plane.

The light collecting lens 72 is so provided on the light incident side of the plurality of lenses 75 as to cover the entire light incident surfaces 75b of the plurality of lenses 75, as shown in FIG. 1. The light collecting lens 72 deflects the plurality of light beam fluxes emitted from the plurality of semiconductor lasers 15 and guides the deflected light beam fluxes to the phosphor layer 42, which is the illuminated area.

The wavelength conversion element 30 includes a fluorescence emitting element 45 and a motor 50, which rotates the fluorescence emitting element 45. The fluorescence emitting element 45 includes a substrate 38, the phosphor layer 42, and a dichroic layer 44.

The substrate 38 rotates around a rotating shaft 51 when the motor 51 is driven. The substrate 38 has a circular shape when viewed in the direction in which the rotating shaft 51 extends (z direction). The substrate 38 is made of a material that transmits the blue light B. The material of the substrate 38 can, for example, be quartz glass, crystallized quartz, sapphire, optical glass, or transparent resin.

The phosphor layer 42 is annularly provided on a first surface 38a of the substrate 38 along the circumferential direction thereof. The phosphor layer 42 is excited by the blue light B having the wavelength of 445 nm and emits the fluorescence YL containing green light G and red light R. The phosphor layer 42 is formed, for example, of a layer containing $(Y,Gd)_3(Al,Ga)_5O_{12}$:Ce, which is one type of YAG-based phosphor. The phosphor layer 42 is desirably irradiated with the blue light B that is excitation light and has a uniform illuminance distribution.

The dichroic layer 44 is provided between the substrate 38 and the phosphor layer 42. The dichroic layer 44 transmits the blue light B emitted from the semiconductor lasers 15 but reflects the fluorescence YL generated by the phosphor layer 42.

The blue light B having exited out of the light forming system 70 successively passes through the substrate 38 and the dichroic layer 44 and enters the phosphor layer 42. Since the phosphor layer 42 outputs white light as described above, the wavelength conversion element 30 outputs the white light toward the side opposite the side on which the blue light B emitted from the light source 10 is incident. That is, the wavelength conversion element 30 in the present embodiment is a transmissive wavelength conversion element.

The pickup system 60 includes a first pickup lens 62 and a second pickup lens 64. The pickup system 60 roughly parallelizes the light having exited out of the wavelength conversion element 30 and outputs the resultant light toward the downstream optical system. The first pickup lens 62 and the second pickup lens 64 are each formed of a convex lens.

The first lens array 120 includes a plurality of first microlenses 122. The first lens array 120 divides the light having exited out of the pickup system 60 into a plurality of sub-light fluxes. The plurality of first microlenses 122 are arranged in a matrix in a plane perpendicular to an illumination optical axis 100ax.

The second lens array 130 includes a plurality of second microlenses 132 corresponding to the plurality of first microlenses 122 of the first lens array 120. The second lens array 130, along with the superimposing lens 150, forms images of the first microlenses 122 of the first lens array 120 in the vicinity of image formation areas of the light modulators 400R, 400G, and 400B. The plurality of second microlenses 132 are arranged in a matrix in a plane perpendicular to the illumination optical axis 100ax.

The polarization conversion element 140 converts each of the plurality of divided sub-light fluxes from the first lens array 120 into linearly polarized light. The polarization conversion element 140 has a polarization separation layer that directly transmits one linearly polarized light component of the polarized light components contained in the light having exited out of the wavelength conversion element 30 and reflects another linearly polarized light component in the direction perpendicular to the illumination optical axis 100ax, a reflection layer that reflects the other linearly polarized light component reflected off the polarization separation layer in the direction parallel to the illumination optical axis 100ax, and a retardation film that converts the other linearly polarized light component reflected off the reflection layer into the one linearly polarized light component.

The superimposing lens 150 superimposes the plurality of sub-light fluxes having exited out of the polarization conversion element 140 on one another in the vicinity of the image formation areas of the light modulators 400R, 400G, and 400B. The first lens array 120, the second lens array 130, and the superimposing lens 150 form an optical integration system that homogenizes the intensity distribution of the light from the wavelength conversion element 30 in the image formation areas.

The color separation/light guide system 200 includes dichroic mirrors 210 and 220, reflection mirrors 230, 240, and 250, and relay lenses 260 and 270. The color separation/light guide system 200 separates the light outputted from the illuminator 100 into the red light R, the green light G, and the blue light B and guides the red light R, the green light G, and the blue light B to the corresponding light modulators 400R, 400G, and 400B.

A light collecting lens 300R is disposed between the color separation/light guide system 200 and the light modulator 400R. A light collecting lens 300G is disposed between the color separation/light guide system 200 and the light modulator 400G. A light collecting lens 300B is disposed between the color separation/light guide system 200 and the light modulator 400B.

The dichroic mirror 210 transmits the red light component and reflects the green light component and the blue light component. The dichroic mirror 220 reflects the green light component and transmits the blue light component.

The red light R having passed through the dichroic mirror 210 is reflected off the reflection mirror 230, passes through the light collecting lens 300R, and is incident on the image formation area of the light modulator 400R for red light. The green light G reflected off the dichroic mirror 210 is further reflected off the dichroic mirror 220, passes through the light collecting lens 300G, and is incident on the image formation area of the light modulator 400G for green light. The blue light B having passed through the dichroic mirror 220 travels via the relay lens 260, the reflection mirror 240, the relay lens 270, the reflection mirror 250, and the light collecting lens 300B and is incident on the image formation area of the light modulator 400B for blue light.

The light modulators 400R, 400G, and 400B modulate the color light fluxes incident thereon in accordance with image information to form image light fluxes. The light modulators 400R, 400G, and 400B are each formed of a transmissive liquid crystal panel. Although not shown, light-incident-side polarizers are disposed between the light collecting lens 300R and the light modulator 400R, between the light collecting lens 300G and the light modulator 400G, and between the light collecting lens 300B and the light modulator 400B. Light-exiting-side polarizers are disposed between the light modulators 400R, 400G, 400B and the cross dichroic prism 500.

The cross dichroic prism 500 combines the image light fluxes outputted from the light modulators 400R, 400G, and 400B with one another. The cross dichroic prism 500 has a configuration in which four rectangular prisms are bonded to each other. Dielectric multilayer films are formed on the roughly X-letter-shaped interfaces between the bonded rectangular prisms.

The color image having exited out of the cross dichroic prism 500 is enlarged and projected by the projection system 600 and forms an image on a screen SCR.

According to the illuminator 100 of the present embodiment, adjustment of the shape of the light irradiated area and homogenization of the illuminance distribution across the illuminated area (phosphor layer 42) are shared by a plurality of lenses, whereby the entire illuminated area can be uniformly illuminated with an increase in the number of parts and an increase in the size of the entire illuminator suppressed. The phosphor layer 42 therefore highly efficiently converts the blue light B into the fluorescence YL.

The present inventor has carried out a simulation for demonstrating the effects of the illuminator 100 according to the present embodiment. In the following simulation, it is assumed that the illuminated area has a square shape.

Figure 9:
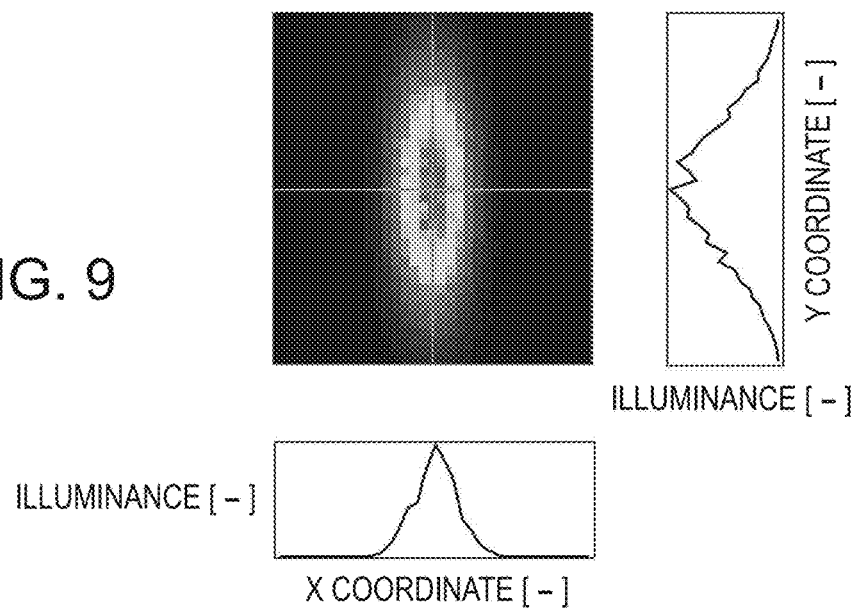
FIG. 9 shows the illuminance distribution across the illuminated area illuminated with a light beam flux from a semiconductor laser.

FIG. 9 shows the illuminance distribution across the illuminated area illuminated with the light beam flux from each of the semiconductor lasers.

The light beam flux emitted from each of the semiconductor lasers has an elliptical illuminance distribution in which the illuminance is high in the central portion and the illuminance is low in the peripheral portion in an xy plane, as shown in FIG. 9. Therefore, when the light beam flux from each of the semiconductor lasers passes through a lens, the illuminance distribution on the light incident surface of the lens has an elliptical shape, such as that shown in FIG. 9.

The shape of a lens surface formed of a free-form surface can be expressed by a polynomial containing the x and y coordinates as variables and having the following Expression (1).

$$z = \frac{cr^2}{1+\sqrt{1-(1+k)c^2r^2}} + \sum_{j=2}^{s} c_j x^m y^n \quad (1)$$

In Expression (1), m and n are each an integer greater than or equal to zero, and k represents the conic constant. c represents a curvature. $c_j$ is the coefficient of the term $x^m y^n$ ($j=[(m+n)^2+m+3n]/2+1$). S and r are expressed as follows: $S=[(m_1+n_1)^2+m_1+3n_1]/2+1$; and $r=\sqrt{(x^2+y^2)}$. $m_1$ and $m_2$ are upper limits of m and n, respectively.

In the design of a free-form lens, the shape of the lens surface can be designed by adjusting the coefficient $c_j$ in Expression (1) as appropriate. The expression of a free-form surface is not limited to Expression (1), but using Expression (1) readily allows the lens design because the curvature of the lens surface in the x direction and the curvature of the lens surface in the y direction can be designed independently of each other. As a result, the illuminance distribution across the illuminated area illuminated with a light beam flux having passed through the free-form surface and the shape of the light irradiated area can both be adjusted.

More specifically, for example, let p be a positive integer, and the coefficient $c_j$ may be so set that at least one term expressed by $x^{2p} \times y^{2p}$ is contained. The setting allows the size of the light irradiated area in an xy plane and in directions that intersect both the x and y axes to be readily adjusted. That is, the shape of the corners of the light irradiated area can be readily adjusted.

Further, let h be a positive integer, and the coefficient Cj of the term $x^h$ may be so set as to differ from the coefficient Cj of the term $y^h$. The setting allows the size of the light irradiated area to be adjusted in the x and y directions independently of each other.

Further, the coefficient Cj of the term $x^2 \cdot y^4$ may be so set as to differ from the coefficient Cj of the term $x^4 \cdot y^2$. The setting allows the size of the light irradiated area to be adjusted with accuracy in the diagonal directions, the x direction, and the y direction independently of each other.

As Comparative Example, consider an illuminator in which the illuminated area is irradiated with the light beam fluxes from the semiconductor lasers via a single free-form lens.

Figure 10:
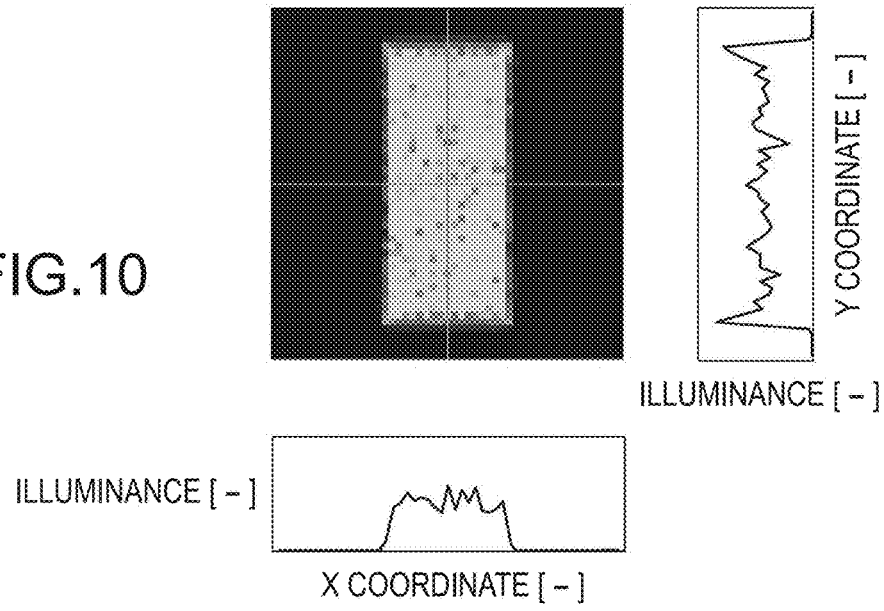
FIG. 10 shows the illuminance distribution across the illuminated area in a light source apparatus according to Comparative Example.

FIG. 10 shows the illuminance distribution across the illuminated area in the illuminator according to Comparative Example.

Using a free-form lens allows conversion of the illuminance distribution shown in FIG. 9 into the illuminance distribution shown in FIG. 10. As for the illuminance distribution in the y direction, adjustment of the coefficient $c_j$ in Expression (1) allowed the illuminance to be roughly homogenized roughly across the illuminated area, as shown in FIG. 10.

On the other hand, as for the illuminance distribution in the x direction, adjusting the curvature of the free-form surface in the x direction in such a way that the relationship between the light exiting surfaces of the semiconductor lasers and the illuminated area approaches a conjugate relationship roughly achieved homogenization of the illuminance distribution across the light irradiated area. However, since the light exiting surfaces of the semiconductor lasers each have an elliptical shape, the light irradiated area has a rectangular shape having a widthwise direction that coincides with the x direction and a lengthwise direction that coincides with the y direction. That is, in the configuration of Comparative Example, the shape of the light irradiated area does not conform to the shape of the illuminated area, so that the entire illuminated area cannot be illuminated.

Figure 11:
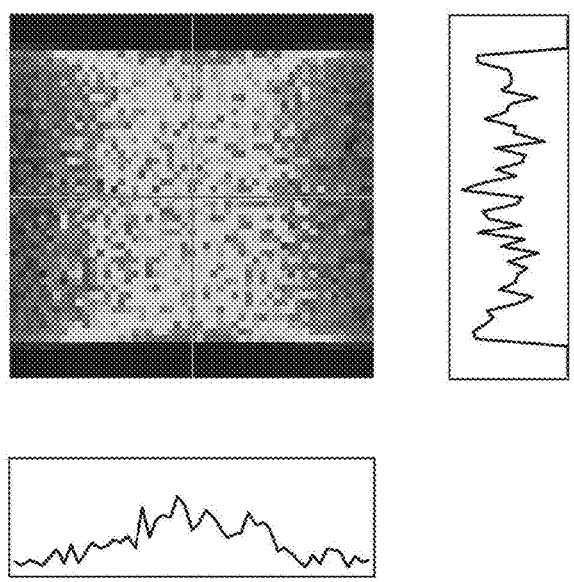
FIG. 11 shows the illuminance distribution across the illuminated area in a case where the light irradiated area is enlarged in the x direction in the illuminator according to Comparative Example.

To allow the shape of the light irradiated area to approach a square shape, an attempt to adjust the coefficient $c_j$ of each term containing x in Expression (1) in a variety of manners was made to allow the shape of the light irradiated area to coincide with the shape of the illuminated area. FIG. 11 shows a result of the adjustment.

FIG. 11 shows the illuminance distribution across the illuminated area in a case where the light irradiated area is enlarged in the x direction in the illuminator according to Comparative Example.

As a result of the adjustment of the coefficient $c_j$ of each term containing x in Expression (1), the light irradiated area was successively enlarged in the x direction to cause the shape of the light irradiated area to approach a roughly square shape, as shown in FIG. 11. However, the degree of uniformity of the illuminance in the x direction in the illuminated area decreased.

A simulation was then carried out as Example in a case where the number of free-form lenses on which a single light beam flux is incident is 6.

FIG. 5A is a plan view showing the positions of central lenses 77C and 77D in a lens array 77 in the present Example. FIG. 5B shows the illuminance distribution produced by the lenses 77C and 77D across the illuminated area. FIG. 5C shows a conceptual expression of the illuminance distribution produced by the lenses 77C and 77D across the illuminated area.

Let a first sub-light beam flux be the sub-light beam flux having passed through the left lens 77C, let a second sub-light beam flux be the sub-light beam flux having passed through the right lens 77D, and the lens array 77 is configured to cause the first sub-light beam flux and the second sub-light beam flux to travel in direction different from each other. Further, the light forming system is configured to cause the principal ray of the first sub-light beam flux and the principal ray of the second sub-light beam flux to be incident on positions different from each other in the illuminated area.

According to the configuration described above, the central two lenses 77C and 77D form an illuminance distribution extending in the x direction and having peaks on the right and left sides of the center line of the illuminated area in the x direction, as shown in FIGS. 5B and 5C.

Figure 6A:
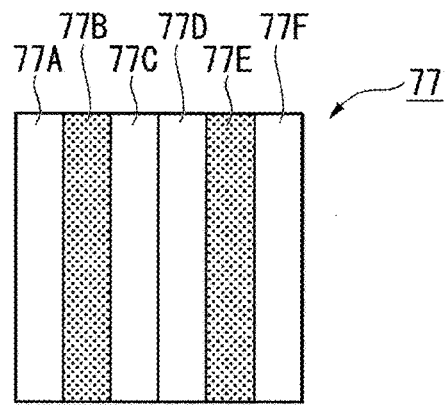
FIG. 6A is a plan view showing the positions of a lens that is the second lens from the left end and a lens that is the second lens from the right end in the lens array in Example.
Figure 6B:
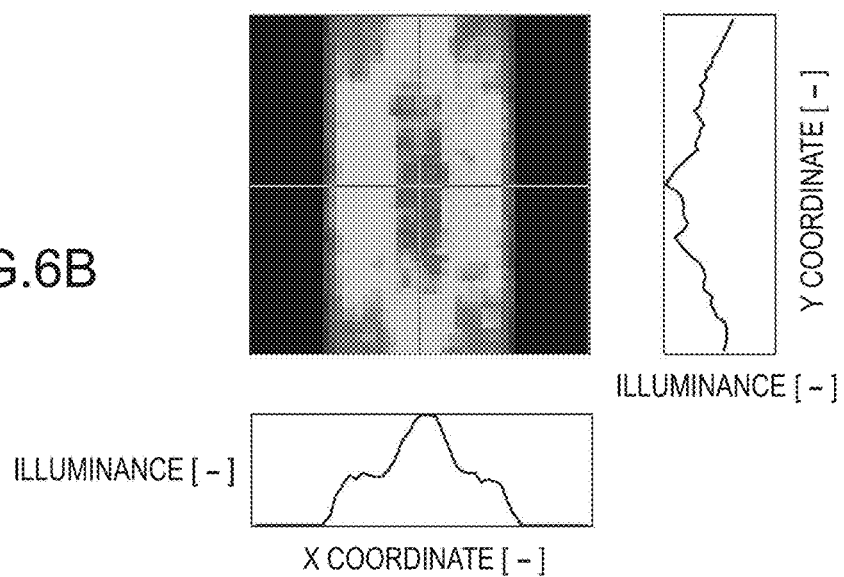
FIG. 6B shows the illuminance distribution produced by the lenses in FIG. 6A across the illuminated area.
Figure 6C:
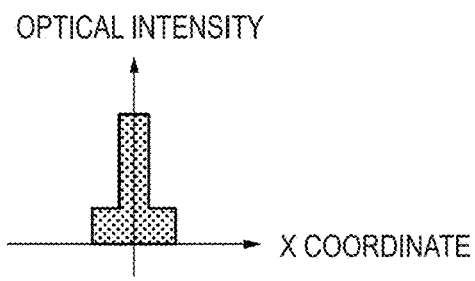
FIG. 6C shows a conceptual expression of the illuminance distribution produced by the lenses in FIG. 6A across the illuminated area.

FIG. 6A is a plan view showing the positions of a lens 77B, which is the second lens from the left end, and a lens 77E, which is the second lens from the right end, in the lens array 77 in the present Example. FIG. 6B shows the illuminance distribution produced by the lenses 77B and 77E across the illuminated area. FIG. 6C shows a conceptual expression of the illuminance distribution produced by the lenses 77B and 77E across the illuminated area.

Let a third sub-light beam flux be the sub-light beam flux having passed through the lens 77B, let a fourth sub-light beam flux be the sub-light beam flux having passed through the lens 77E, and the lens array 77 is configured to cause the third sub-light beam flux and the fourth sub-light beam flux to travel in directions different from each other. Further, the light forming system is configured to cause the principal ray of the third sub-light beam flux and the principal ray of the fourth sub-light beam flux to be incident on positions different from each other in the illuminated area.

According to the configuration described above, the lenses 77B and 77E form an illuminance distribution extending in the x direction and having one peak on the center line of the illuminated area in the x direction, as shown in FIGS. 6B and 6C.

Figure 7A:
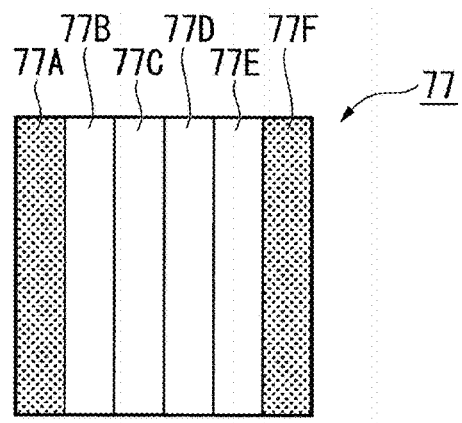
FIG. 7A is a plan view showing the positions of a left-end lens and a right-end lens in the lens array in Example.
Figure 7B:
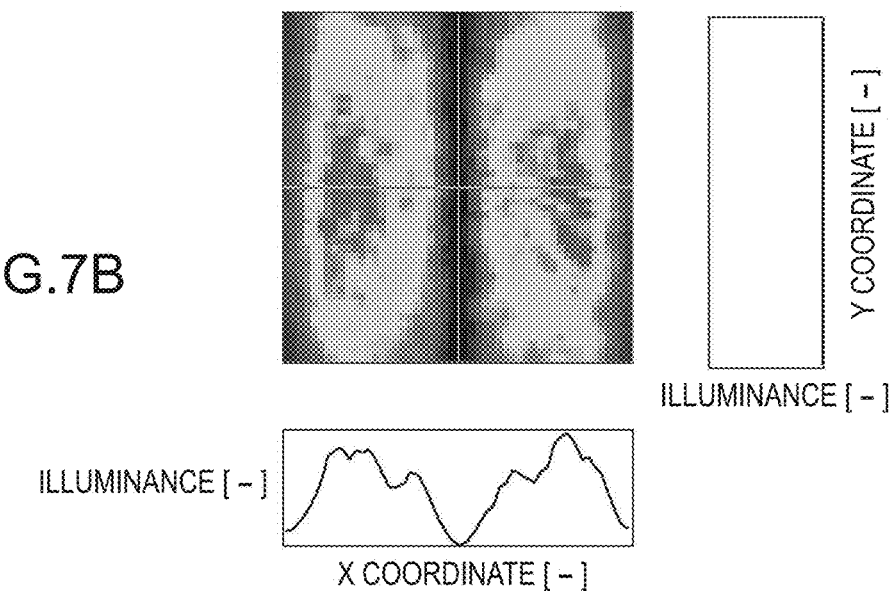
FIG. 7B shows the illuminance distribution produced by the lenses in FIG. 7A across the illuminated area.
Figure 7C:
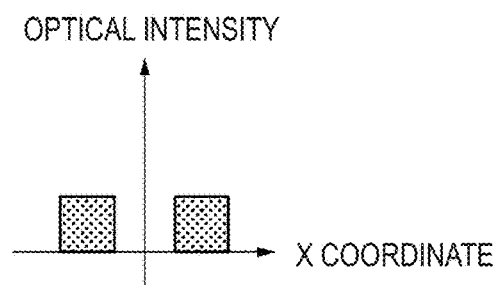
FIG. 7C shows a conceptual expression of the illuminance distribution produced by the lenses in FIG. 7A across the illuminated area.

FIG. 7A is a plan view showing the positions of a left-end lens 77A and a right-end lens 77F in the lens array 77 in the present Example. FIG. 7B shows the illuminance distribution produced by the lenses 77A and 77F across the illuminated area. FIG. 7C shows a conceptual expression of the illuminance distribution produced by the lenses 77A and 77F across the illuminated area.

Let a fifth sub-light beam flux be the sub-light beam flux having passed through the left lens 77A, let a sixth sub-light beam flux be the sub-light beam flux having passed through the right lens 77F, and the lens array 77 is configured to cause the fifth sub-light beam flux and the sixth sub-light beam flux to travel in direction different from each other. Further, the light forming system is configured to cause the principal ray of the fifth sub-light beam flux and the principal ray of the sixth sub-light beam flux to be incident on positions different from each other in the illuminated area.

According to the configuration described above, the lenses 77A and 77F form an illuminance distribution extending in the x direction and having peaks on the right and left sides of the center line of the illuminated area in the x direction, as shown in FIGS. 7B and 7C.

In the above description, to show the illuminance distribution produced by the six sub-light beam fluxes and the irradiation positions thereof in an easy-to-understand manner, the description has been made with the six lenses divided into groups formed of two lenses. In practice, however, one illuminated area is irradiated with all the six sub-light beam fluxes having exited out of the six lenses at the same time. The illuminance distribution is therefore produced as a whole as follows.

Figure 8A:
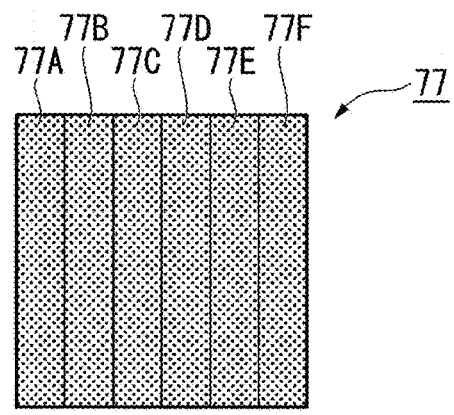
FIG. 8A is a plan view showing the positions of all the lenses in the lens array in Example.
Figure 8B:
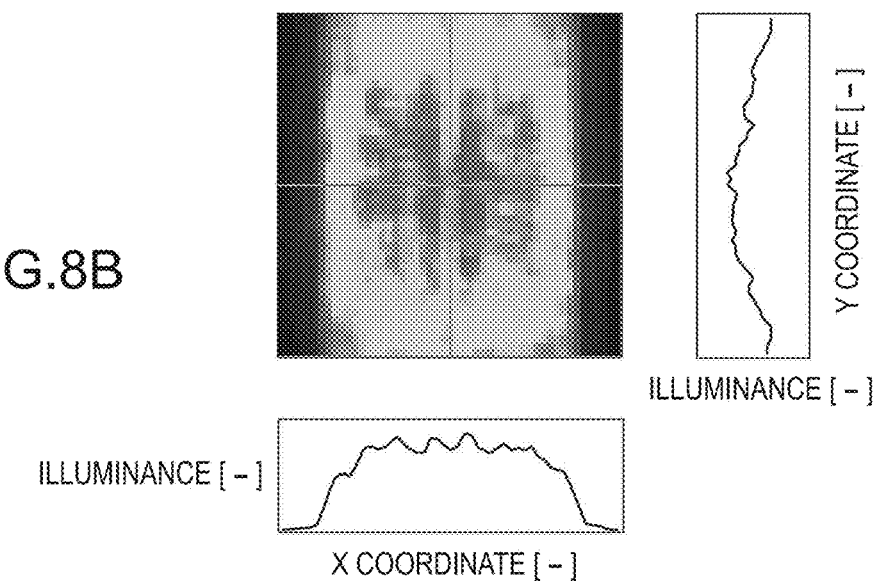
FIG. 8B shows the illuminance distribution produced by the lenses in FIG. 8A across the illuminated area.
Figure 8C:
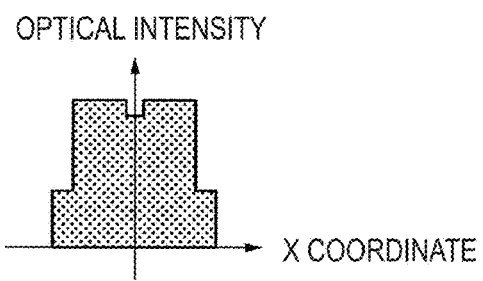
FIG. 8C shows a conceptual expression of the illuminance distribution produced by the lenses in FIG. 8A across the illuminated area.

FIG. 8A is a plan view showing the positions of all the lenses 77A to 77F. FIG. 8B shows the illuminance distribution produced by all the lenses 77A to 77F across the illuminated area. FIG. 8C shows a conceptual expression of the illuminance distribution produced by all the lenses 77A to 77F across the illuminated area.

The lens array 77 in the present Example successively greatly improved the uniformity of the illuminance distribution in the x direction across the illuminated area, as compared with the uniformity of the illuminance distribution in the illuminator according to Comparative Example shown in FIG. 11, as shown in FIGS. 8B and 8C. Further, the shape of the light irradiated area was successively adjusted to a roughly square shape with the uniformity of the illuminance distribution maintained. The illuminator according to the present Example can therefore be used to illuminate the phosphor layer for an increase in the conversion efficiency of the phosphor layer.

Second Embodiment

A second embodiment of the invention will be described below with reference to FIG. 12.

The basic configuration of a projector according to the second embodiment is the same as that in the first embodiment, but the configuration of the illuminator differs from that in the first embodiment.

Figure 12:
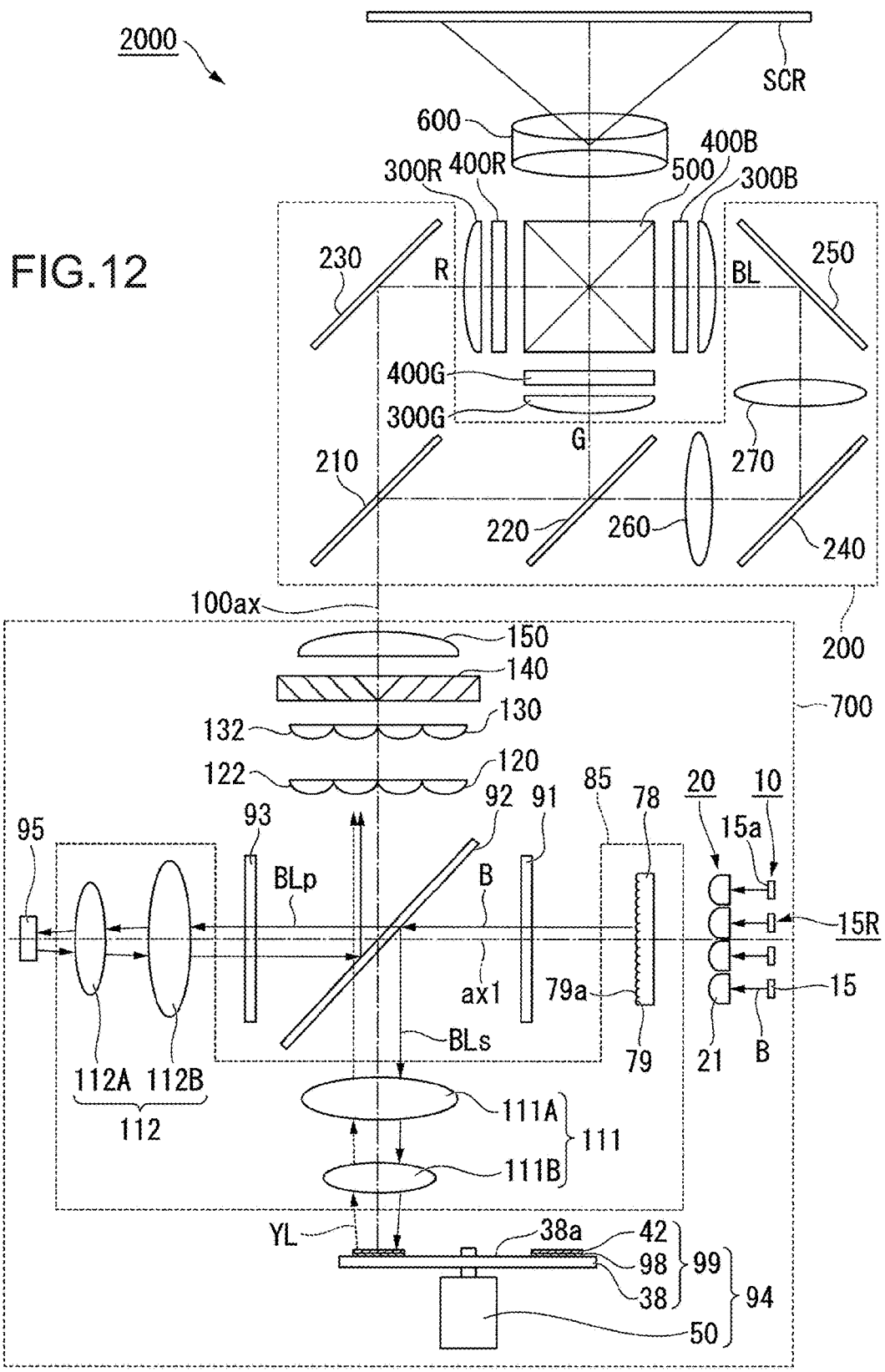
FIG. 12 is a schematic configuration diagram of a projector according to a second embodiment.

FIG. 12 is a schematic configuration diagram of a projector 2000 according to the second embodiment.

In FIG. 12, the components common to those in the drawings used in the first embodiment have the same reference characters and will not be described.

An illuminator 700 includes the light source 10, the collimation system 20, a light forming system 85, a first retardation film 91, a light separation element 92, a second retardation film 93, a wavelength conversion element 94, and a diffuser/reflector 95. The light forming system 85 includes a lens array 78, a first light collecting system 111, and a second light collecting system 112. The first light collecting system 111 is provided on the optical path between the light separation element 92 and the wavelength conversion element 94. The second light collecting system 112 is provided on the optical path between the light separation element 92 and the diffuser/reflector 95. The first light collecting system 111 and the second light collecting system 112 correspond to the light collecting system in the appended claims.

Among the constituent requirements described above, the light source 10, the collimation system 20, the lens array 78, the first retardation film 91, the light separation element 92, the second retardation film 93, the second light collecting system 112, and the diffuser/reflector 95 are sequentially arranged along an optical axis ax1 shown in FIG. 12. The light separation element 92, the first light collecting system 111, and the wavelength conversion element 94 are sequentially arranged along the optical axis $100ax$ shown in FIG. 12. The optical axis ax1 and the optical axis $100ax$ are present in the same plane and so positioned as to be perpendicular to each other.

In the illuminator 700 according to the present embodiment, the light forming system 85 includes the lens array including a plurality of lenses 79. The first light collecting system 111 and the second light collecting system 112 are each a component separate from the lens array 78. The plurality of lenses 79 each have a lens surface 79a formed of a non-rotationally symmetric free-form surface. The lens array 78 is configured to cause the plurality of lenses 79 to divide a light beam flux having passed through the collimation system 20 into a plurality of sub-light beam fluxes and the plurality of sub-light beam fluxes to be incident on an illuminated area. The light source 10 and the collimation system 20 are configured in the same manner as in the first embodiment.

The first retardation film 91 is provided on the optical path between the lens array 78 and the light separation element 92. The first retardation film 91 is so provided as to be rotatable around the optical axis ax1 as the axis of rotation. The first retardation film 91 is formed of a half-wave plate that functions as a half-wave plate for the wavelength of 445 nm of the light emitted from the light source 10. The optic axis of the first retardation film 91 intersects the polarization axis of the sub-light beam fluxes incident on the first retardation film 91. The optic axis of the first retardation film 91 may be the fast axis or the slow axis of the first retardation film 91.

In the present embodiment, the blue light B emitted from the light source 10 is S-polarized light, and the first retardation film 91 converts the blue light B into blue light B containing the S-polarized component and the P-polarized component mixed with each other at a predetermined ratio. Rotating the first retardation film 91 allows the ratio between the S-polarized component and the P-polarized component to be changed.

The light separation element 92, which is formed of a polarization separation element having wavelength selectivity, is provided on the optical path between the first retardation film 91 and the second retardation film 93. The light separation element 92 has a polarization separation function of separating the plurality of sub-light beam fluxes into an S-polarized component BLs and a P-polarized component BLp with respect to the light separation element 92. Specifically, the light separation element 92 reflects the S-polarized component BLs and transmits the P-polarized component BLp. The S-polarized component BLs reflected off the light separation element 92 is used to excite the phosphor layer 42. On the other hand, the P-polarized component BLp having passed through the light separation element 92 is applied onto the diffuser/reflector 95.

The light separation element 92 further has a color separation function of transmitting the yellow fluorescence YL that belongs to a wavelength band different from the wavelength band to which the blue light B belongs irrespective of the polarization state of the fluorescence YL.

The S-polarized component BLs having exited out of the light separation element 92 enters the first light collecting system 111. The first light collecting system 111 collects the S-polarized component BLs and directs the collected S-polarized component BLs toward the phosphor layer 42 of the wavelength conversion element 94. That is, among the plurality of sub-light beam fluxes, assuming that one sub-light beam flux is a first sub-light beam flux and another is a second sub-light beam flux, the first light collecting system 111 causes the first sub-light beam flux and the second sub-light beam flux to travel in directions different from each other and guides them to the phosphor layer 42. The first light collecting system 111 is formed of a first light collecting lens 111A and a second light collecting lens 111B.

The light beam flux having exited out of the first light collecting system 111 is incident as the excitation light on the phosphor layer 42 of the wavelength conversion element 94. The wavelength conversion element includes a fluorescence emitting element 99 including the substrate 38, the phosphor layer 42, and a reflection layer 98. The phosphor layer 42 is provided on the first surface 38a of the substrate 38 (surface facing light separation element 92), and the reflection layer 98 is provided between the phosphor layer 42 and the substrate 38. The fluorescence YL generated by the phosphor layer 42 is reflected off the reflection layer 98 and directed toward the first surface 38a of the substrate 38. That is, the wavelength conversion element 30 in the first embodiment is a transmissive wavelength conversion element, whereas the wavelength conversion element 94 in the second embodiment is a reflective wavelength conversion element.

The fluorescence YL having exited out of the wavelength conversion element 94 is incident on the light separation element 92 via the first light collecting system 111. The fluorescence YL passes through the light separation element 92 and travels toward the first lens array 120, which forms the optical integration system.

On the other hand, the P-polarized component BLp having exited out of the light separation element 92 is incident on the second retardation film 93. The second retardation film 93 is formed of a quarter-wave plate disposed on the optical path between the light separation element 92 and second light collecting system 112. The P-polarized component BLp having exited out of the light separation element 92 is therefore converted by the second retardation film 93 into a plurality of sub-light beam fluxes formed of circularly polarized light and then enters the second light collecting system 112.

The second light collecting system 112 collects the plurality of sub-light beam fluxes having exited out of the second retardation film 93 and directs them toward the diffuser/reflector 95. That is, among the plurality of sub-light beam fluxes, assuming that one sub-light beam flux is a first sub-light beam flux and another is a second sub-light beam flux, the second light collecting system 112 causes the first sub-light beam flux and the second sub-light beam flux to travel in directions different from each other. The second light collecting system 112 is formed of a third light collecting lens 112A and a fourth light collecting lens 112B.

The diffuser/reflector 95 diffuses and reflects the sub-light beam fluxes having exited out of the second light collecting system 112 and directs them toward the light separation element 92. In particular, the diffuser/reflector 95 preferably reflects the sub-light beam fluxes incident thereon in the form of Lambertian reflection. In the illuminator 700, using the diffuser/reflector 95 of this type allows uniform illuminance distribution of the plurality of sub-light beam fluxes.

The polarization state of the sub-light beam fluxes diffused by and reflected off the diffuser/reflector 95 is converted into S-polarized light by the second retardation film 93. S-polarized sub-light beam fluxes therefore exit out of the second retardation film 93. The S-polarized sub-light beam fluxes are reflected off the light separation element 92 and travel toward the first lens array 120, which forms the optical integration system.

As described above, the S-polarized sub-light beam fluxes reflected off the light separation element 92, along with the fluorescence YL having passed through the light separation element 92, are used as illumination light. The illuminator 700 thus outputs white illumination light. The optical systems downstream of the first lens array 120 are the same as those in the first embodiment.

In the illuminator 700 according to the present embodiment, the phosphor layer 42 corresponds to the illuminated area produced by the lens array 78 and the first light collecting system 111. Further, the diffuser/reflector 95 corresponds to the illuminated area produced by the lens array 78 and the second light collecting system 112. According to the illuminator 700, adjustment of the shape of the light irradiated area and homogenization of the illuminance distribution across the illuminated area are shared by the plurality of lenses 79 of the lens array 78, whereby the entire illuminated area can be uniformly illuminated with an increase in the number of parts and an increase in the size of the entire apparatus suppressed.

Further, in the illuminator 700 according to the present embodiment, the light forming system 85 includes the first light collecting system 111 and the second light collecting system 112, and the first light collecting system 111 and the second light collecting system 112 are each configured to cause different sub-light beam fluxes to travel in directions different from each other. The positions where the plurality of sub-light beam fluxes are incident on the illuminated area can thus be adjusted. The illuminance distribution across the illuminated area is therefore readily homogenized. Further, unlike in a case where the light forming system 85 includes no light collecting system, the free-form surfaces do not need to provide an effect of deflecting the sub-light beam fluxes, whereby the free-form surface can be designed with increased flexibility.

The technical scope of the invention is not limited to the embodiments described above, and a variety of changes can be made thereto to the extent that the changes do not depart from the substance of the invention.

For example, in the embodiments described above, the wavelength conversion element or the diffuser/reflector is the illuminated area. The light modulators may instead be the illuminated area. That is, the plurality of divided sub-light beam fluxes from the plurality of lenses of the light forming system may be caused to be incident on the light modulators. In this case, the illuminator outputs the plurality of sub-light beam fluxes as the illumination light, and the light modulators modulate the illumination light outputted from the illuminator in accordance with image information to produce image light.

In the embodiments described above, the projector including the three liquid crystal light modulators 400R, 400G, and 400B as the light modulators is presented by way of example. The invention is also applicable to a projector that displays color video images via a single liquid crystal light modulator. Further, a digital mirror device may be used as each of the light modulators.

In addition to the above, the shape, the number, the arrangement, the material, and other factors of the variety of components of the illuminator and the projector are not limited to those in the embodiments described above and can be changed as appropriate.

In the embodiments described above, the case where the illuminator according to any of the embodiments of the invention is incorporated in a projector is presented by way of example, but not necessarily. The light source apparatus according to any of the embodiments of the invention may be used with a lighting apparatus, a headlight of an automobile, and other apparatus.

The entire disclosure of Japanese Patent Application No. 2017-009614, filed on Jan. 23, 2017 is expressly incorporated by reference herein.

What is claimed is:

1. An illuminator comprising:
a light source;
a collimation system on which a light beam flux emitted from the light source is incident; and
a light forming system including a lens array including a plurality of lenses, wherein the plurality of lenses each have a lens surface having a non-rotationally symmetric free-form surface,
the light forming system is configured to cause the plurality of lenses to divide the light beam flux having passed through the collimation system into a plurality of sub-light beam fluxes and the plurality of sub-light beam fluxes to be incident on an illuminated area,
the plurality of sub-light beam fluxes include a first sub-light beam flux and a second sub-light beam flux, and
the lens array is configured to cause the first sub-light beam flux and the second sub-light beam flux to travel in directions different from each other.

2. The illuminator according to claim 1,
wherein a spot formed by the light beam flux on the lens array has a longitudinal direction, and
the plurality of lenses are arranged in a direction that intersects the longitudinal direction.

3. A projector comprising:
the illuminator according to claim 2;
a light modulator that modulates illumination light from the illuminator in accordance with image information to produce image light; and
a projection system that projects the image light.

4. The illuminator according to claim 1,
wherein let an x axis and a y axis be two axes perpendicular to each other in a plane perpendicular to an optical axis of one of the plurality of lenses, and
a shape of the lens surface is expressed by Expression (1) containing x and y as variables:

$$z = \frac{cr^2}{1 + \sqrt{1 - (1+k)c^2 r^2}} + \sum_{j=2}^{s} c_j x^m y^n. \quad (1)$$

5. The illuminator according to claim 4, wherein Expression (1) contains at least one term expressed by $x^{2p} \times y^{2p}$, where p is a positive integer.

6. A projector comprising:
the illuminator according to claim 5;
a light modulator that modulates illumination light from the illuminator in accordance with image information to produce image light; and
a projection system that projects the image light.

7. The illuminator according to claim 4, wherein a coefficient Cj of a term $x^h$ differs from the coefficient Cj of a term $y^h$, where h is a positive integer.

8. A projector comprising:
the illuminator according to claim 7;
a light modulator that modulates illumination light from the illuminator in accordance with image information to produce image light; and
a projection system that projects the image light.

9. The illuminator according to claim 4, wherein a coefficient Cj of a term $x^2 \cdot y^4$ differs from the coefficient Cj of a term $x^4 \cdot y^2$.

10. A projector comprising:
the illuminator according to claim 9;
a light modulator that modulates illumination light from the illuminator in accordance with image information to produce image light; and
a projection system that projects the image light.

11. A projector comprising:
the illuminator according to claim 4;
a light modulator that modulates illumination light from the illuminator in accordance with image information to produce image light; and
a projection system that projects the image light.

12. The illuminator according to claim 1, wherein the light forming system is configured to cause a principal ray of the first sub-light beam flux and a principal ray of the second sub-light beam flux to be incident on positions different from each other in the illuminated area.

13. A projector comprising:
the illuminator according to claim 1;
a light modulator that modulates illumination light from the illuminator in accordance with image information to produce image light; and
a projection system that projects the image light.

14. The projector according to claim 13, wherein the illuminator further includes a wavelength conversion element that converts the plurality of sub-light beam fluxes into fluorescence, and the illuminator outputs the fluorescence as the illumination light.

15. The projector according to claim 13, wherein the illuminator outputs the plurality of sub-light beam fluxes as the illumination light.

16. An illuminator comprising:
a light source;
a collimation system on which a light beam flux emitted from the light source is incident; and
a light forming system including a lens array including a plurality of lenses,
wherein the plurality of lenses each have a lens surface having a non-rotationally symmetric free-form surface,
the light forming system is configured to cause the plurality of lenses to divide the light beam flux having passed through the collimation system into a plurality of sub-light beam fluxes and the plurality of sub-light beam fluxes to be incident on an illuminated area,
the plurality of sub-light beam fluxes include a first sub-light beam flux and a second sub-light beam flux,
the light forming system further includes a light collecting system, and
the light collecting system is configured to cause the first sub-light beam flux and the second sub-light beam flux to travel in directions different from each other.

17. The illuminator according to claim 16, further comprising a light separation element provided on an optical path between the lens array and the light collecting system and a diffuser/reflector on which the plurality of sub-light beam fluxes are incident via the light collecting system.

18. A projector comprising:
the illuminator according to claim 16;
a light modulator that modulates illumination light from the illuminator in accordance with image information to produce image light; and
a projection system that projects the image light.

* * * * *